(12) United States Patent
Liu

(10) Patent No.: US 9,941,357 B2
(45) Date of Patent: Apr. 10, 2018

(54) POWER MOSFET

(71) Applicant: Excelliance MOS Corporation, Hsinchu County (TW)

(72) Inventor: Chu-Kuang Liu, Hsinchu County (TW)

(73) Assignee: Excelliance MOS Corporation, Hsinchu County (TW)

( * ) Notice: Subject to any disclaimer, the term of this patent is extended or adjusted under 35 U.S.C. 154(b) by 0 days.

(21) Appl. No.: 15/182,586

(22) Filed: Jun. 14, 2016

(65) Prior Publication Data

US 2017/0338309 A1 Nov. 23, 2017

(30) Foreign Application Priority Data

May 18, 2016 (TW) .............................. 105115306 A

(51) Int. Cl.
*H01L 29/40* (2006.01)
*H01L 29/10* (2006.01)
*H01L 29/78* (2006.01)

(52) U.S. Cl.
CPC ........ *H01L 29/1083* (2013.01); *H01L 29/407* (2013.01); *H01L 29/7813* (2013.01)

(58) Field of Classification Search
CPC .. H01L 29/1083; H01L 29/405; H01L 29/408
USPC ....................................................... 257/331
See application file for complete search history.

(56) References Cited

U.S. PATENT DOCUMENTS

| 7,385,248 | B2 | 6/2008 | Herrick et al. |
| 7,598,144 | B2 | 10/2009 | Herrick et al. |
| 8,143,123 | B2 | 3/2012 | Grebs et al. |
| 8,143,124 | B2 | 3/2012 | Challa et al. |
| 8,497,549 | B2 | 7/2013 | Madson |
| 8,610,205 | B2 | 12/2013 | Probst |
| 2007/0037327 | A1 | 2/2007 | Herrick et al. |
| 2008/0090339 | A1 | 4/2008 | Herrick et al. |

(Continued)

FOREIGN PATENT DOCUMENTS

TW 200625645 7/2006
TW 200709300 3/2007

(Continued)

OTHER PUBLICATIONS

"Office Action of Taiwan Counterpart Application", dated Sep. 19, 2016, p. 1-p. 4.

(Continued)

*Primary Examiner* — Moazzam Hossain
*Assistant Examiner* — Omar Mojaddedi
(74) *Attorney, Agent, or Firm* — JCIPRNET

(57) ABSTRACT

A power MOSFET includes a substrate, a semiconductor layer, a first gate, a second gate, a thermal oxide layer, a first CVD oxide layer, and a gate oxide layer. The semiconductor layer is formed on the substrate and has at least one trench. The first gate is located inside the trench. The second gate is located inside the trench on the first gate, wherein the second gate has a first portion and a second portion, and the second portion is located between the semiconductor layer and the first portion. The thermal oxide layer is located between the first gate and the semiconductor layer. The first CVD oxide layer is located between the first gate and the second gate. The gate oxide layer is generally located between the second gate and the semiconductor layer.

6 Claims, 4 Drawing Sheets

(56) References Cited

U.S. PATENT DOCUMENTS

| | | | |
|---|---|---|---|
| 2009/0050959 A1* | 2/2009 | Madson | H01L 29/7813 257/332 |
| 2011/0089485 A1 | 4/2011 | Gao et al. | |
| 2013/0323921 A1* | 12/2013 | Burke | H01L 21/02164 438/589 |
| 2015/0044837 A1 | 2/2015 | Ng et al. | |
| 2015/0214313 A1* | 7/2015 | Oh | H01L 27/10876 257/2 |

FOREIGN PATENT DOCUMENTS

| | | |
|---|---|---|
| TW | 200715416 | 4/2007 |
| TW | 200802853 | 1/2008 |
| TW | 200832709 | 8/2008 |

OTHER PUBLICATIONS

"Office Action of Taiwan Related Application, application No. 105115311", dated Oct. 27, 2017, p. 1-p. 5.

* cited by examiner

POWER MOSFET

CROSS-REFERENCE TO RELATED APPLICATION

This application claims the priority benefit of Taiwan application serial no. 105115306, filed on May 18, 2016. The entirety of the above-mentioned patent application is hereby incorporated by reference herein and made a part of this specification.

BACKGROUND OF THE INVENTION

Field of the Invention

The invention relates to a MOSFET (Metal-Oxide-Semiconductor Field-Effect Transistor) technique, and more particularly, to a power MOSFET.

Description of Related Art

A split-gate power MOSFET can also be referred to as a shielded-gate power MOSFET, and the structure thereof includes two separated gates isolated by an inter-poly-dielectric (IPD) inside a trench MOSFET, and thus the two separated gates has two different potentials. The gate located above is utilized to form a channel in the MOSFET, and the gate located below is electrically coupled to a source potential via a metal interconnect for generating two-dimensional charge balance under blocking operation. In addition, the IPD may reduce excessive gate-source capacitance (Cgs) in a traditional trench MOSFET, so as to reduce switching loss.

However, since the thermal oxidation method used in the manufacture of the split-gate power MOSFET causes diffusion of dopant ions, the two separated gates cannot be effectively isolated. As a result, a higher potential cannot be tolerated when the split-gate power MOSFET is used in high-voltage applications.

SUMMARY OF THE INVENTION

The invention provides a power MOSFET. The efficiency of the power MOSFET can be maintained under high voltage field, and the manufacturing reliability of the power MOSFET can be increased.

A power MOSFET of the invention includes a substrate, a semiconductor layer, a first gate, a second gate, a thermal oxide layer, a first CVD oxide layer, and a gate oxide layer. The semiconductor layer is formed on the substrate, and the semiconductor layer has at least one trench. The first gate is located inside the trench. The second gate is located inside the trench on the first gate, wherein the second gate has a first portion and a second portion, and the second portion is located between the semiconductor layer and the first portion. The thermal oxide layer is located between the first gate and the semiconductor layer. The first CVD oxide layer is located between the first gate and the second gate. The gate oxide layer is located between the second gate and the semiconductor layer.

In an embodiment of the invention, the thermal oxide layer can further be located between the first CVD oxide layer and the first gate.

In an embodiment of the invention, the gate oxide layer can further be extended between the first CVD oxide layer and the semiconductor layer and between the thermal oxide layer and the semiconductor layer.

In an embodiment of the invention, the power MOSFET can further include a second CVD oxide layer located between the first gate and the thermal oxide layer and a silicon nitride layer located between the second CVD oxide layer and the thermal oxide layer.

In an embodiment of the invention, the second portion of the second gate can further be extended downward between the first CVD oxide layer and the gate oxide layer.

In an embodiment of the invention, the second portion in the second gate can further cover the first portion.

In an embodiment of the invention, the material of the first gate includes metal, polysilicon, amorphous silicon, or a combination thereof.

In an embodiment of the invention, the material of the second gate includes metal, polysilicon, amorphous silicon, or a combination thereof.

In an embodiment of the invention, the material of the first portion is different from the material of the second portion.

In an embodiment of the invention, the first and second CVD oxide layers each independently include a high-temperature CVD oxide (HTO) layer or are formed by using tetraethyl orthosilicate (TEOS) as a raw material.

In an embodiment of the invention, the first gate can have a rounded corner.

Based on the above, according to the power MOSFET of the invention, the occurrence of leakage current under high operating voltage can be effectively prevented by using a CVD oxide layer as a structural layer isolating the first and second gates. Moreover, the second gate of the power MOSFET of the invention has first and second portions, and therefore variation to the manufacture can be increased via the first portion and the second portion formed in different steps.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

The figures in the following embodiments are intended to more comprehensively describe the exemplary embodiments of the inventive concept, but the invention can still be implemented in many different forms, and the invention should not be construed as limited to the recited embodiments. In the figures, for clarity, the relative thickness and location of film layers, regions, and/or structural devices may be reduced or enlarged. Moreover, in the present specification, "first" and "second" . . . etc. are used to describe different regions, film layers, and/or blocks, but such terms are only intended to differentiate a region, film layer, or block from another region, film layer, or block. Therefore, a first region, film layer, or block discussed below can be referred to as a second region, film layer, or block without compromising the teaching of the embodiment.

Figure 1:
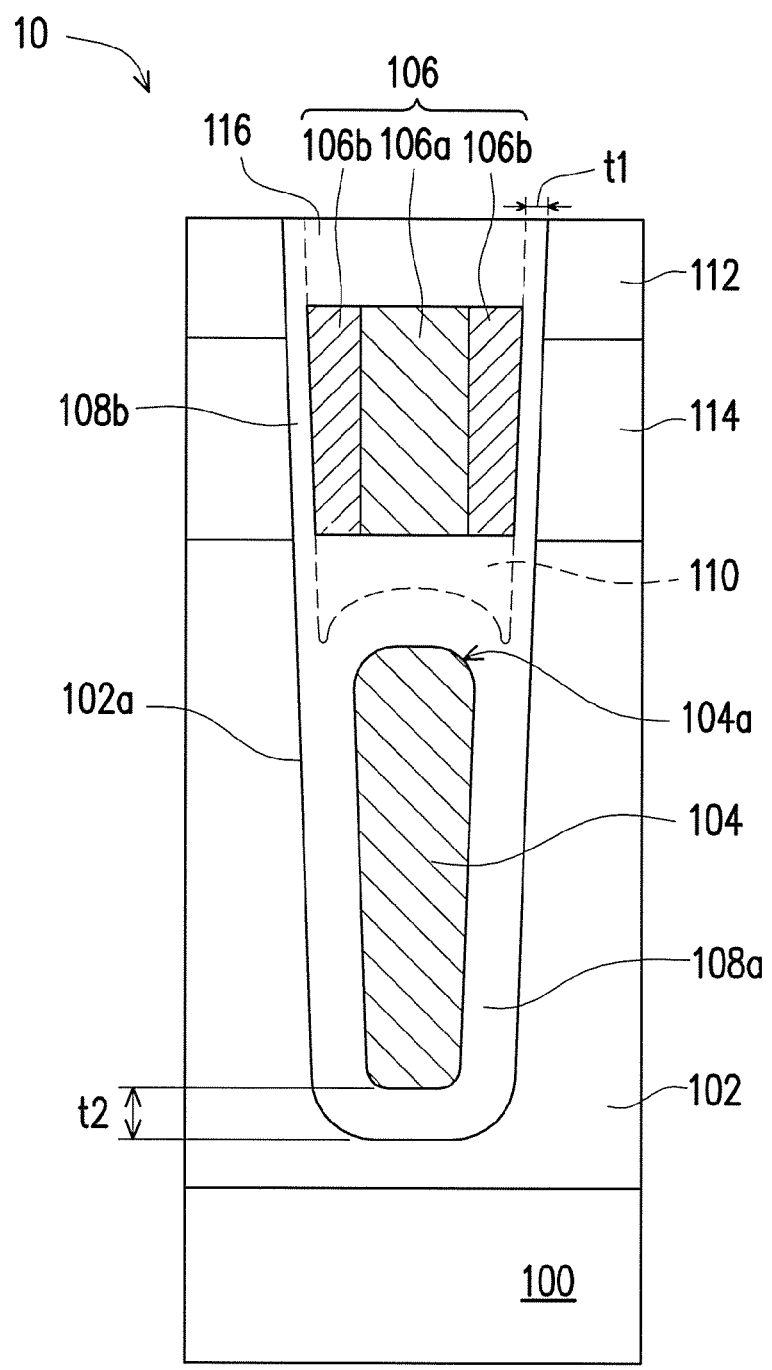
FIG. 1 is a cross-sectional schematic of a power MOSFET according to the first embodiment of the invention.

FIG. 1 is a cross-sectional schematic of a power MOSFET according to the first embodiment of the invention.

Referring to FIG. 1, a power MOSFET 10 of the present embodiment includes a substrate 100, a semiconductor layer 102 having a trench 102a, a first gate 104, a second gate 106, a thermal oxide layer 108a, a gate oxide layer 108b, and a first CVD oxide layer 110. In particular, the semiconductor layer 102 is formed on the substrate 100, and the semiconductor layer 102 is, for instance, a doped silicon layer or a doped epitaxial layer. The first gate 104 is located inside the trench 102. In the first embodiment, the first gate 104 has a rounded corner 104a; in other words, the corner of the first gate 104 is round and is not a fang structure having a protrusion, and therefore input capacitance (such as gate-source capacitance (Cgs)) can be reduced, or the occurrence of reverse leakage current (such as gate leakage current (Igss)) can be reduced. As a result, the reliability of the power MOSFET 10 can be increased.

Referring further to FIG. 1, the second gate 106 is located inside the trench 102a on the first gate 104, wherein the second gate 106 has a first portion 106a and a second portion 106b, and the second portion 106b is located between the semiconductor layer 102 and the first portion 106a. In the present embodiment, the materials of the first gate 104 and the second gate 106 are, for instance, each independently metal, polysilicon, amorphous silicon, or a combination thereof, and the forming method thereof includes chemical vapor deposition (CVD), physical vapor deposition (PVD), or other suitable film-forming processes. Moreover, in the present embodiment, the first portion 106a and the second portion 106b of the second gate 106 can be formed separately, and therefore the material of the first portion 106a can be different from the material of the second portion 106b. Moreover, during the manufacture of the power MOSFET 10, the first portion 106a of the second gate 106 can be used as a protective layer protecting the first CVD oxide layer 110 in an etching process, and therefore the first portion 106a is preferably a material having lower etching rate than oxide, so as to protect the first CVD oxide layer 110 located between the first gate 104 and the second gate 106. As a result, in addition to conductive material such as metal, polysilicon, or amorphous silicon used as the gate, the first portion 106a of the second gate 106 can also adopt a non-conductive material having lower etching rate than oxide, such as silicon nitride. The second portion 106b of the second gate 106 is located at the sidewall of the first portion 106a and is in direct contact therewith, and therefore in addition to repairing damages to the side surface of the first portion 106a used as a protective layer during an etching process, the second portion 106b can also form a complete second gate 106 with the first portion 106a.

Referring further to FIG. 1, the thermal oxide layer 108a is located between the first gate 104 and the semiconductor layer 102. In the present embodiment, the manufacture of the thermal oxide layer 108a using a thermal oxidation method adopts, for instance, a higher process temperature (900-1200° C.), and therefore the resulting silicon dioxide has higher compactness, and can be used as surface protection in the early stages of the manufacture (i.e., before the first gate 104 and the second gate 106 are formed). The first CVD oxide layer 110 is located between the first gate 104 and the second gate 106, and the thermal oxide layer 108a can further be located between the first CVD oxide layer 110 and the first gate 104. In the present embodiment, the first CVD oxide layer 110 refers to oxide formed using CVD, such as a high temperature CVD oxide (HTO) layer or a film layer formed by using tetraethyl orthosilicate (TEOS) as a raw material, and the forming method thereof is, for instance, low-pressure chemical vapor deposition (LPCVD). Since the oxide quality of the first CVD oxide layer 110 is superior to the oxide layer formed by a thermal oxidation method, the first CVD oxide layer 110 can effectively isolate the first gate 104 and the second gate 106, such that the power MOSFET 10 of the present embodiment can tolerate higher potential without leakage current.

Referring further to FIG. 1, the gate oxide layer 108b is located between the second gate 106 and the semiconductor layer 102, and a source region 112 and a well region 114 are generally disposed inside the semiconductor layer 102, and therefore FIG. 1 shows that the gate oxide layer 108b is mostly located between the second gate 106 and the well region 114. A drain region (not shown) is generally disposed on the side of the substrate 100 without the semiconductor layer 102. In the first embodiment, since the gate oxide layer 108b can be formed with the thermal oxide layer 108a at the same time via process design and then thinned out via other steps, the gate oxide layer 108b and the thermal oxide layer 108a can be regarded as the same layer, but a thickness t1 of the gate oxide layer 108b is generally less than a thickness t2 of the thermal oxide layer 108a, and the gate oxide layer 108b can be extended between the first CVD oxide layer 110 and the semiconductor layer 102. However, the invention is not limited thereto, and the material of the gate oxide layer 108b can also be different from the material of the thermal oxide layer 108a. For instance, the gate oxide layer 108b can also be manufactured using the same method as the first CVD oxide layer 110. Moreover, a film layer such as an insulating layer 118 can be disposed on the second gate 106 according to the design.

Figure 2:
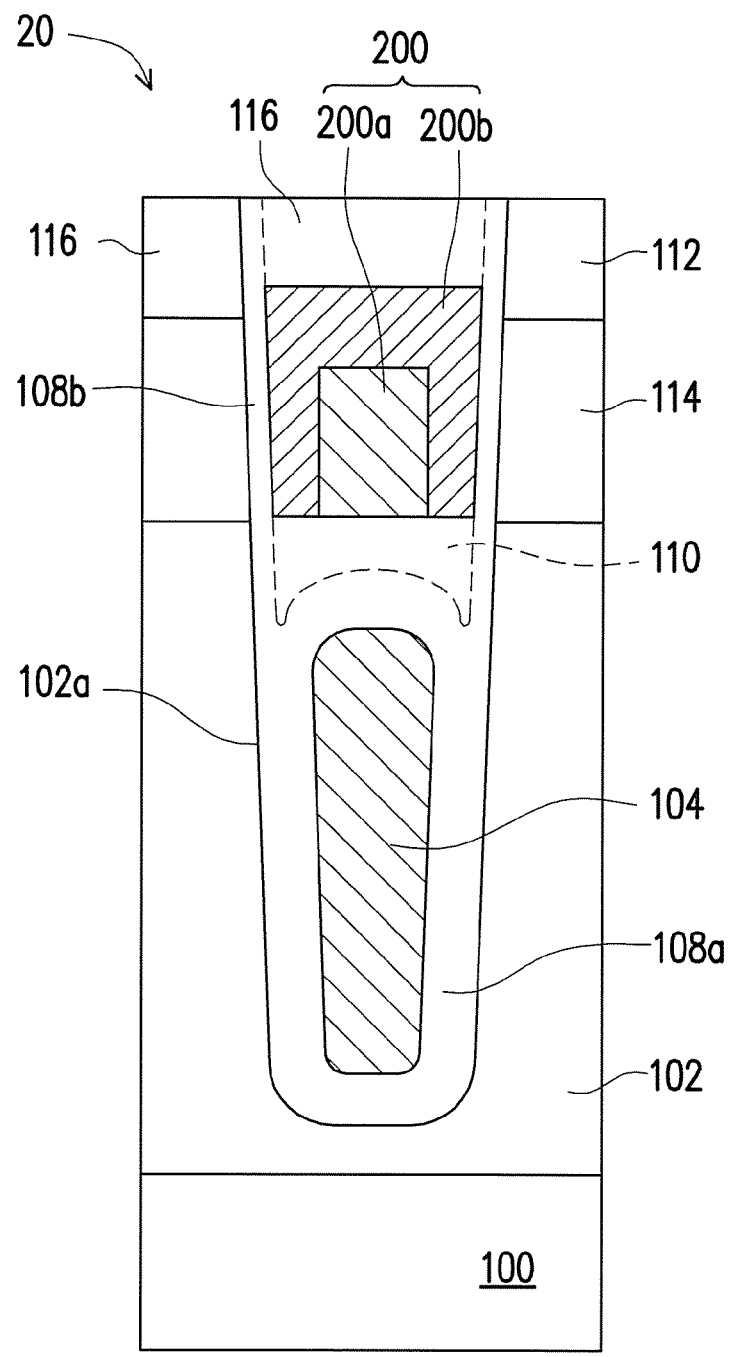
FIG. 2 is a cross-sectional schematic of a power MOSFET according to the second embodiment of the invention.

FIG. 2 is a cross-sectional schematic of a power MOSFET according to the second embodiment of the invention, wherein the same reference numerals as in the first embodiment are used to represent the same or similar portions, and relevant descriptions thereof are not repeated herein.

Referring to FIG. 2, a second portion 200b in a second gate 200 of a power MOSFET 20 of the second embodiment is not only located between the semiconductor layer 102 and a first portion 200a, but also covers a first portion 200a; that is, the second portion 200b covers the entire first portion 200a, and therefore in addition to repairing damages to the first portion 200a during an etching process, the second portion 200b can also be completely filled in the gap of the first portion 200a. Even if the first portion 200a is not a conductive material, the second gate 200 can still be operated smoothly since the second portion 200b is disposed in an active region.

Figure 3:
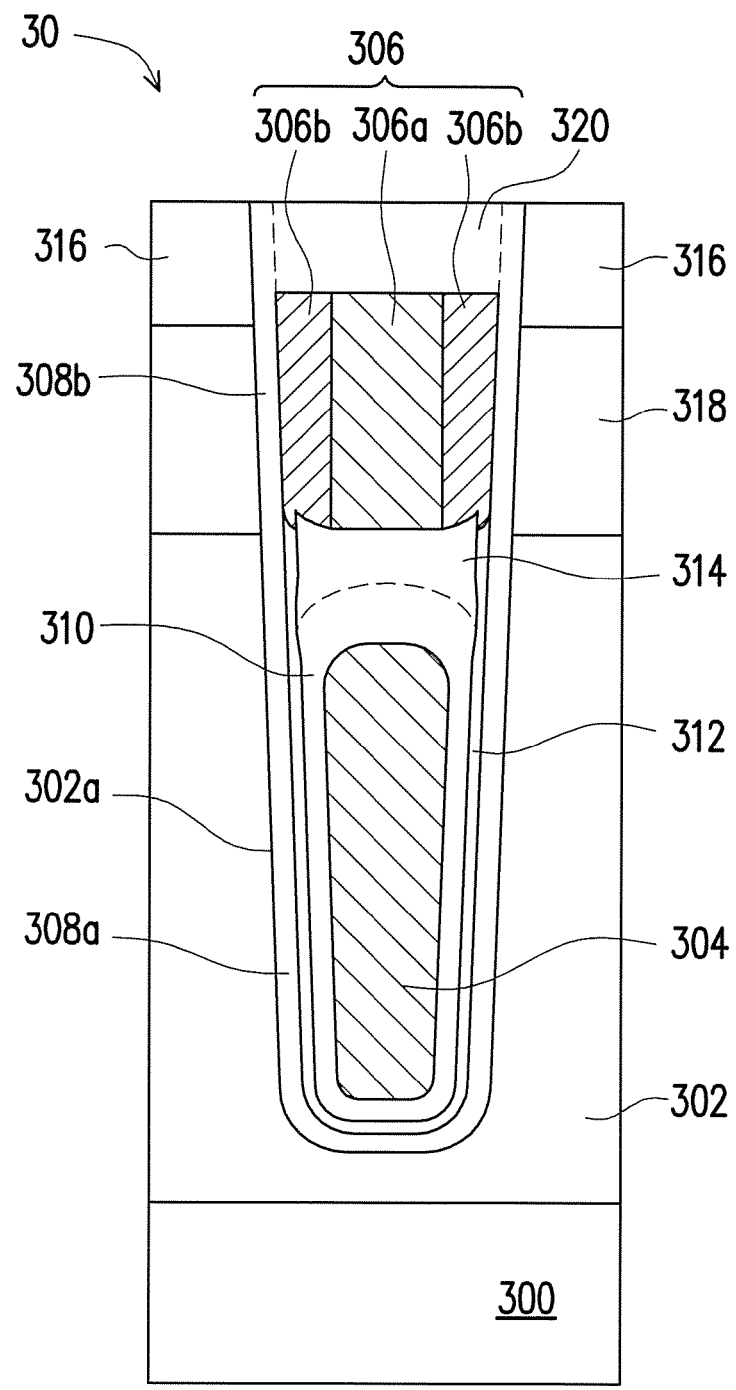
FIG. 3 is a cross-sectional schematic of a power MOSFET according to the third embodiment of the invention.

FIG. 3 is a cross-sectional schematic of a power MOSFET according to the third embodiment of the invention.

Referring to FIG. 3, a power MOSFET 30 of the present embodiment includes a substrate 300, a semiconductor layer 302 having a trench 302a, a first gate 304, a second gate 306, a thermal oxide layer 308a, a gate oxide layer 308b, a silicon nitride layer 312, a first CVD oxide layer 314, and a second CVD oxide layer 310, wherein the semiconductor layer 302 is formed on the substrate 300, the first gate 304 is located inside the trench 302a, the second gate 306 is located inside the trench 302a on the first gate 304, and the second gate 306 has a first portion 306a and a second portion 306b located between the semiconductor layer 302 and the first portion 306a. The detailed materials or structures of the semiconductor layer 302, the first gate 304, and the second gate 306 are the same as for the components of the first embodiment and are therefore not repeated herein.

Referring further to FIG. 3, the difference between the power MOSFET 30 of the present embodiment and that of the first embodiment is that the power MOSFET 30 has the second CVD oxide layer 310 and the silicon nitride layer 312, wherein the second CVD oxide layer 310 is located between the first gate 304 and the thermal oxide layer 308a, and the silicon nitride layer 312 is located between the second CVD oxide layer 310 and the thermal oxide layer 308a. The second CVD oxide layer 310 and the first CVD oxide layer 314 both refer to oxide formed using CVD, and are each independently, for instance, a high-temperature CVD oxide (HTO) layer or a film layer formed by using tetraethyl orthosilicate (TEOS) as a raw material, and the forming method thereof is, for instance, low-pressure chemical vapor deposition (LPCVD). In addition to being located between the second gate 306 and the semiconductor layer 302, the gate oxide layer 308b is further extended between the first CVD oxide layer 314 and the semiconductor layer 302. Moreover, the second portion 306b of the second gate 306 can further be extended downward between the first CVD oxide layer 314 and the gate oxide layer 308b. A source region 316 and a well region 318 are generally disposed inside the semiconductor layer 302, and the drain region (not shown) is generally disposed on the side of the substrate 300 without the semiconductor layer 302. Moreover, a film layer such as an insulating layer 320 can be disposed inside the trench 302a on the second gate 306 as needed. In the present embodiment, the forming method of the silicon nitride layer 312 is, for instance, CVD or other suitable film-forming processes. Moreover, the silicon nitride layer 312 can prevent dopants from further diffusing inside the semiconductor layer 302 or the second gate 306 and effectively isolate the semiconductor layer 302 and the second gate 306, such that the reliability of the power MOSFET 30 of the third embodiment can be increased.

Figure 4:
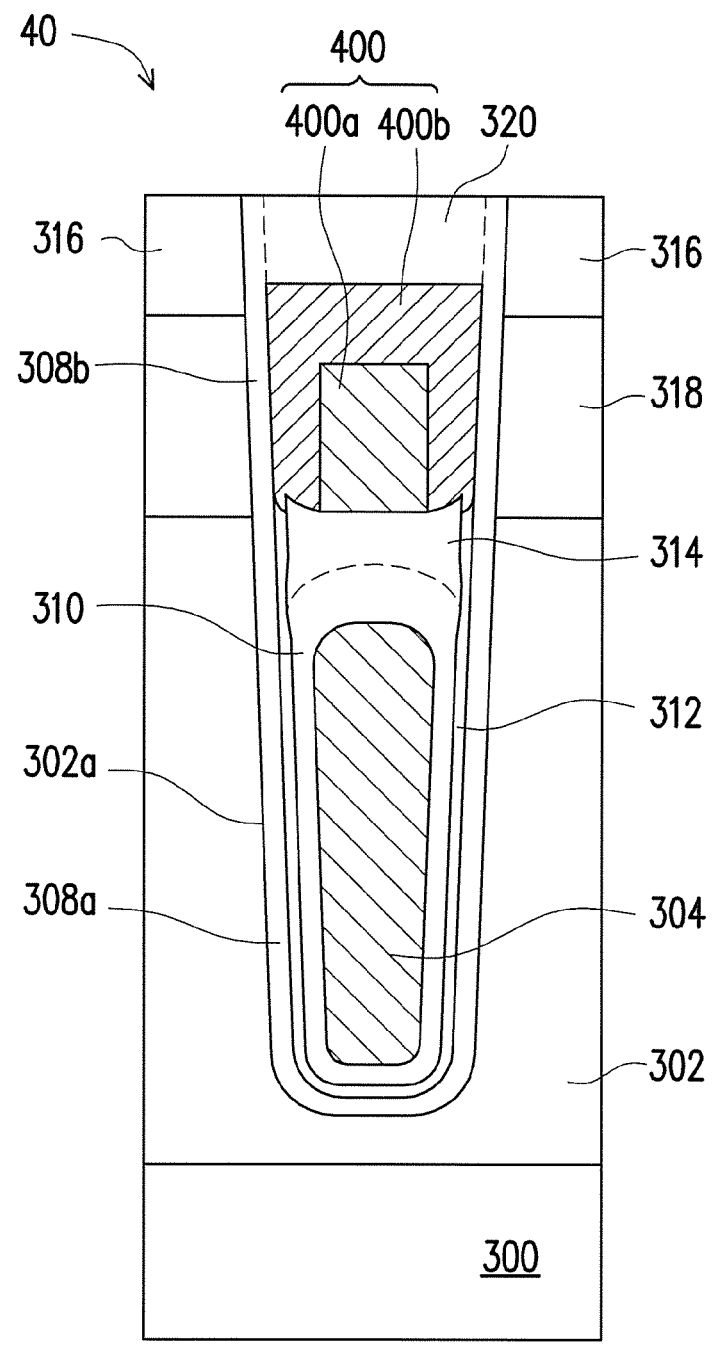
FIG. 4 is a cross-sectional schematic of a power MOSFET according to the fourth embodiment of the invention.

FIG. 4 is a cross-sectional schematic of a power MOSFET according to the fourth embodiment of the invention, wherein the same reference numerals as in the third embodiment are used to represent the same or similar portions, and relevant descriptions thereof are not repeated herein.

Referring to FIG. 4, a second portion 400b in a second gate 400 of a power MOSFET 40 of the fourth embodiment is not only located between the semiconductor layer 302 and a first portion 400a, but also covers the first portion 400a, and thus the entire first portion 400a is covered by the second portion 400b. Therefore, the second portion 400b can repair damages to the first portion 400a during an etching process and be completely filled in the gap of the first portion 400a. Moreover, in the case that the first portion 400a is not a conductive material, since the second portion 400b is completely disposed inside an active region, the second gate 400 can also be operated smoothly.

Based on the above, in the invention, a CVD oxide layer is formed between the first gate and the second gate to effectively increase the oxide quality between the first gate and the second gate, and therefore the power MOSFET of the invention can tolerate higher operating voltage without leakage current. As a result, the reliability of the device itself can be increased.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A power metal-oxide-semiconductor field-effect transistor (MOSFET), comprising:
    a substrate;
    a semiconductor layer formed on the substrate, and the semiconductor layer has at least one trench;
    a first gate located inside the trench;
    a second gate located inside the trench on the first gate, wherein the second gate has a first portion and a second portion, the first portion is a nonconductive material, the second portion is located between the semiconductor layer and the first portion, and the second portion is located at a sidewall of the first portion and covers the first portion;
    a thermal oxide layer located between the first gate and the semiconductor layer;
    a first chemical vapor deposition (CVD) oxide layer located between the first gate and the second gate, and the first CVD oxide layer is directly in contact with the first portion and the second portion of the second gate;
    a gate oxide layer located between sidewalls of the second portion of the second gate and the semiconductor layer and between the first CVD oxide layer and the semiconductor layer;
    a second CVD oxide layer located between the first gate and the thermal oxide layer; and
    a silicon nitride layer located between the second CVD oxide layer and the thermal oxide layer and between the first CVD oxide layer and the gate oxide layer, wherein the silicon nitride layer is directly in contact with a bottom of the second portion of the second gate.

2. The power MOSFET of claim 1, wherein the second portion of the second gate is further extended downward between the first CVD oxide layer and the gate oxide layer.

3. The power MOSFET of claim 1, wherein a material of the first gate comprises metal, polysilicon, amorphous silicon, or a combination thereof.

4. The power MOSFET of claim 1, wherein a material of the second portion of the second gate comprises metal, polysilicon, amorphous silicon, or a combination thereof.

5. The power MOSFET of claim 1, wherein the first CVD oxide layer and the second CVD oxide layer each independently comprise a high-temperature CVD oxide (HTO) layer or are foil led by using tetraethyl orthosilicate as a raw material.

6. The power MOSFET of claim 1, wherein the first gate has a rounded corner.

* * * * *